United States Patent
Tsuchida et al.

(10) Patent No.: US 10,528,025 B2
(45) Date of Patent: Jan. 7, 2020

(54) MOTOR DRIVING APPARATUS

(71) Applicant: FANUC CORPORATION, Yamanashi (JP)

(72) Inventors: Kunio Tsuchida, Yamanashi (JP); Taku Sasaki, Yamanashi (JP); Nobuo Hirayama, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 15/952,502

(22) Filed: Apr. 13, 2018

(65) Prior Publication Data

US 2018/0335763 A1 Nov. 22, 2018

(30) Foreign Application Priority Data

May 18, 2017 (JP) .................................. 2017-098890

(51) Int. Cl.
*G05B 19/33* (2006.01)
*H03M 1/20* (2006.01)
*H03M 1/12* (2006.01)

(52) U.S. Cl.
CPC ............ *G05B 19/33* (2013.01); *H03M 1/124* (2013.01); *H03M 1/20* (2013.01); *G05B 2219/37181* (2013.01)

(58) Field of Classification Search
CPC ......... G05B 19/33; G05B 2219/37181; H03M 1/124; H03M 1/20
See application file for complete search history.

(56) References Cited

U.S. PATENT DOCUMENTS 6,590,517 B1 7/2003 Swanson
2007/0159242 A1* 7/2007 Nagatani .................. H03C 5/00
329/347

(Continued)

FOREIGN PATENT DOCUMENTS

JP 07-334299 12/1995
JP 08-152314 6/1996

(Continued)

OTHER PUBLICATIONS

Office Action dated Sep. 25, 2018 in Japanese Patent Application No. 2017-098890.

(Continued)

*Primary Examiner* — Kawing Chan
*Assistant Examiner* — Bradley R Brown
(74) *Attorney, Agent, or Firm* — Wenderoth, Lind & Ponack, L.L.P.

(57) ABSTRACT

A motor driving apparatus includes an amplifier receiving, from a detector, a sine wave shaped signal detected in response to rotation of a motor, and amplifying the signal with a set amplification factor, an A/D converter for performing digital conversion by sampling the signal amplified by the amplifier at a sampling timing in a predetermined cycle, an amplification factor setting part for changing setting of the amplification factor of the amplifier, and an amplification factor set timing command part for issuing a command with respect to a timing for changing the setting of the amplification factor by the amplification factor setting part. The amplification factor set timing command part issues the command with respect to the timing so that a waveform stabilizing period until distortion in a waveform of the signal occurring when the amplification factor setting part changes the setting is stabilized does not overlap with the sampling timing.

8 Claims, 4 Drawing Sheets

(56) References Cited

U.S. PATENT DOCUMENTS

2014/0036250 A1* 2/2014 Okada .................. G01B 7/14
                                                    355/75
2015/0303846 A1* 10/2015 Tatebe .................. H02P 6/16
                                                    318/400.06

FOREIGN PATENT DOCUMENTS

| JP | 2002-199768 | 7/2002 |
| JP | 2014-032105 | 2/2014 |
| JP | 2016-003926 | 1/2016 |
| WO | 2012/131831 | 12/2011 |

OTHER PUBLICATIONS

Office Action dated Mar. 21, 2019 in Chinese Patent Application No. 201810443614.5.

* cited by examiner

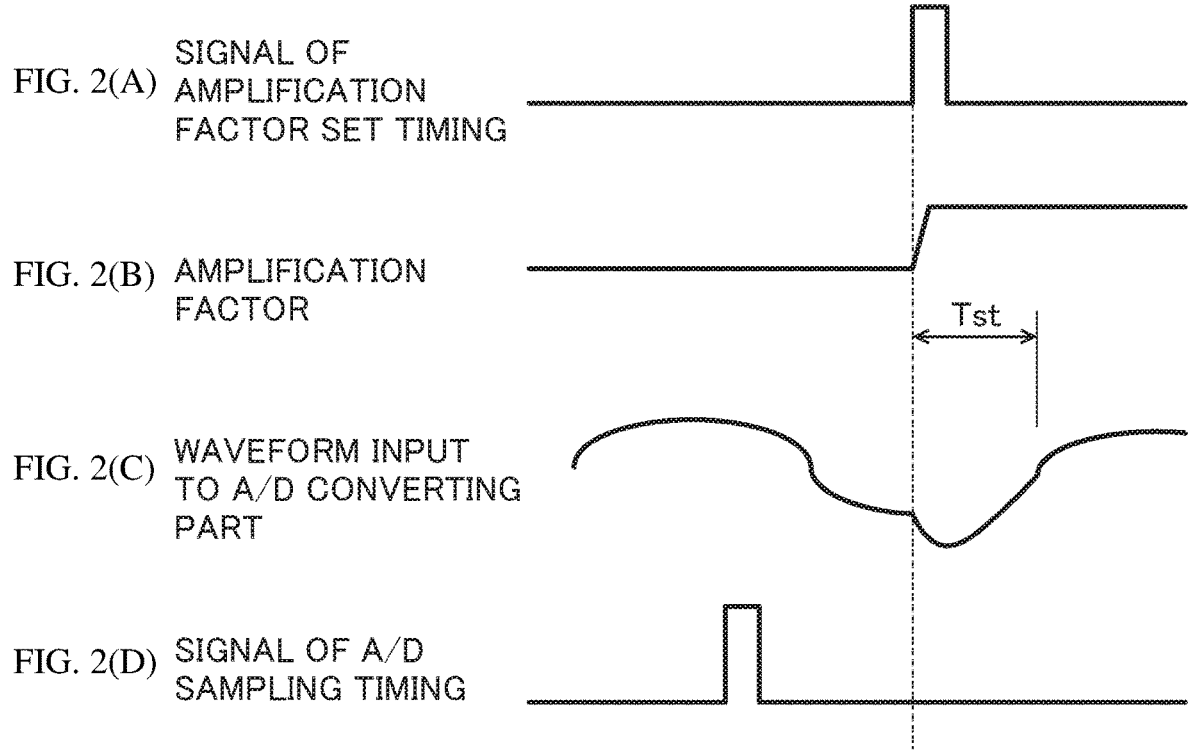

FIG. 3(A) A/D SAMPLING 
FIG. 3(B) AMPLIFICATION FACTOR SET TIMING 
FIG. 4(A) A PHASE SIGNAL /B PHASE SIGNAL 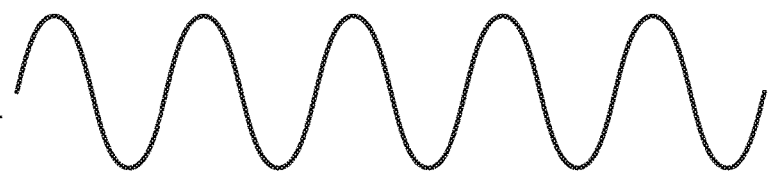
FIG. 4(B) Z PHASE SIGNAL 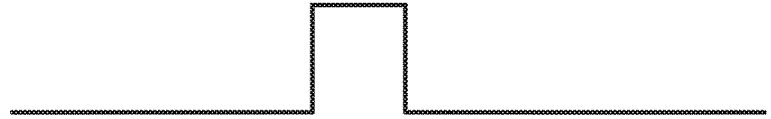

MOTOR DRIVING APPARATUS

This application is based on and claims the benefit of priority from Japanese Patent Application No. 2017-098890, filed on 18 May 2017, the content of which is incorporated herein by reference.

BACKGROUND OF THE INVENTION

Field of the Invention

The present invention relates to a motor driving apparatus for driving a motor.

Related Art

A conventional motor driving apparatus controls a motor by receiving the signal output by a detector (encoder) attached to the motor, and calculating the position, the speed and the like of the motor. In the case where the signal output by the detector is a so-called A/B phase signal which is an analog sine/cosine wave pair, in general, the motor driving apparatus performs processing of: cutting high frequency noise with a low-pass filter; appropriately amplifying the amplitude thereof; performing A/D conversion to obtain a digital value; and converting the digital value into an angle of the motor to calculate the position, the speed and the like (refer to Patent Document 1, as an example).

Patent Document 1: Japanese Unexamined Patent Application, Publication No. 2002-199768

SUMMARY OF THE INVENTION

Under an environment where high frequency noise does not greatly affect the detection resolution, the detection resolution is expected to be improved as the amplification factor thereof is higher. On the other hand, in the case where amplification is performed beyond an input range of an A/D conversion circuit, a sine wave is not reproduced accurately, whereby the detection accuracy deteriorates.

A considered technology to solve the problem is to change an amplification factor on the basis of amplitude of a signal from a detector, as an example. However, since an analog switch or the like is generally used to change an amplification factor of an analog circuit, distortion occurs in a signal at the moment of changing the amplification factor due to influence by switching. If the distorted waveform is subjected to A/D conversion, the detection accuracy thereof is considered to be deteriorated.

The object of the present invention is to provide a motor driving apparatus capable of appropriately changing setting of an amplification factor without influence by a distorted waveform, to improve detection resolution.

(1) A motor driving apparatus (for example, a motor driving apparatus 1, 21 described below) according to the present invention includes an amplifier circuit (for example, an amplifier circuit 10, 10a, 10b described below) for receiving a signal from a detector (for example, a detector 4 described below) outputting the signal in a sine wave shape in response to rotation of a motor (for example, a motor 3 described below), and for amplifying the signal with a set amplification factor, an A/D converting part (for example, an A/D converting part 11, 11a, 11b described below) for performing digital conversion by sampling the signal amplified by the amplifier circuit at a sampling timing in a predetermined cycle, an amplification factor setting part (for example, an amplification factor setting part 7, 7a, 7b described below) for changing setting of the amplification factor of the amplifier circuit, and an amplification factor set timing command part (for example, an amplification factor set timing command part 6 described below) for issuing a command with respect to an amplification factor set timing for changing the setting of the amplification factor by the amplification factor setting part. The amplification factor set timing command part issues the command with respect to the amplification factor set timing so that a waveform stabilizing period until distortion in a waveform of the signal occurring when the amplification factor setting part changes the setting is stabilized does not overlap with the sampling timing.

(2) In the motor driving apparatus according to (1), the amplification factor set timing command part may issue the command with respect to the amplification factor set timing in response to the sampling by the A/D converting part.

(3) In the motor driving apparatus according to (1) or (2), the detector may output a second signal at a fixed point per rotation of the motor, and the amplification factor set timing command part may issue the command with respect to the amplification factor set timing in response to the sampling performed with the second signal as a trigger by the A/D converting part.

(4) In the motor driving apparatus according to any one of (1) to (3), the signal may include a first phase signal and a second phase signal having different phases from each other, and the amplifier circuit, the A/D converting part and the amplification factor setting part may be respectively provided so as to correspond to the first phase signal and the second phase signal one by one. The amplification factor set timing command part may change the setting of the amplification factor of the amplifier circuit corresponding to the first phase signal and the amplification factor of the amplifier circuit corresponding to the second phase signal, at the same time.

The present invention enables to appropriately change setting of an amplification factor without influence by a distorted waveform, thereby enabling to improve detection resolution.

BRIEF DESCRIPTION OF THE DRAWINGS

FIG. 2 (A) is a time history illustrating a timing of changing setting of an amplification factor;

FIG. 2 (B) is a time history illustrating the amplification factor;

FIG. 2 (C) is a time history illustrating a waveform of a signal input to an A/D converting part; and FIG. 2 (D) is a time history illustrating a timing of A/D sampling.

FIG. 3 (A) is the time history illustrating the timing of the A/D sampling, and

FIG. 3 (B) is the time history illustrating the timing of changing the setting of the amplification factor.

FIG. 4 (A) is a time history illustrating a waveform of an A phase signal or a B phase signal output by a detector, and FIG. 4 (B) is a time history illustrating a waveform of a Z phase signal output by the detector.

DETAILED DESCRIPTION OF THE INVENTION

Figure 1:
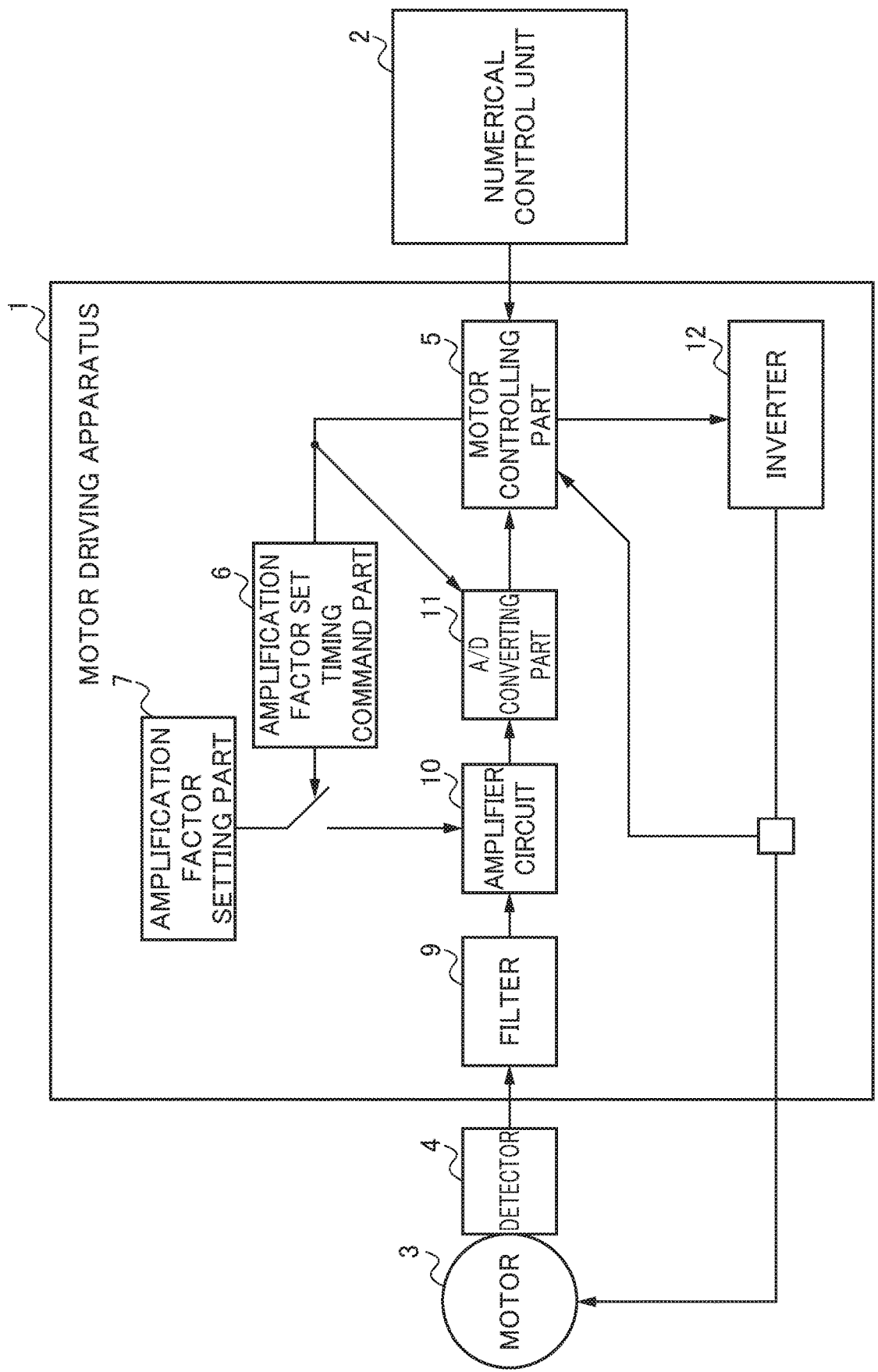
FIG. 1 is a block diagram illustrating a configuration of a motor driving apparatus according to a first embodiment.

A first embodiment of the present invention is described below in detail with reference to the drawings. In the description of a second embodiment, the same reference numerals are given to the configurations common to those of the first embodiment, and the description thereof is omitted.

First Embodiment

FIG. 1 is a block diagram illustrating a configuration of a motor driving apparatus 1 according to the first embodiment of the present invention. FIG. 2 (A) is a time history illustrating a timing of changing setting of an amplification factor. FIG. 2 (B) is a time history illustrating the amplification factor. FIG. 2 (C) is a time history illustrating a waveform of a signal input to an A/D converting part 11. FIG. 2 (D) is a time history illustrating a timing of A/D sampling. FIG. 3 (A) is the time history illustrating the timing of the A/D sampling. FIG. 3 (B) is the time history illustrating the timing of changing the setting of the amplification factor. FIG. 4 (A) is a time history illustrating an A phase signal or a B phase signal output by a detector 4. FIG. 4 (B) is a time history illustrating a Z phase signal output by the detector 4.

As shown in FIG. 1, the motor driving apparatus 1 according to the first embodiment drives a motor 3 for a spindle in a machine tool on the basis of a command from a numerical control unit (CNC) 2. Specifically, the motor driving apparatus 1 drives the motor 3 while feeding back, as a signal, information including the position and the speed of the motor 3 detected by the detector (encoder) 4. The motor 3 is applicable to various types of motors used for a feeding shaft or a spindle of a machine tool, an arm of an industrial machine or an industrial robot, or the like.

It is noted that the signals output by the detector 4 include an A phase signal (a first phase signal) and a B phase signal (a second phase signal) in sine wave shapes having different phases from each other output in response to the rotation of the motor 3, and a Z phase signal (a second signal) output at a fixed point per rotation of the motor 3.

The motor driving apparatus 1 includes a motor controlling part 5, an amplification factor set timing command part 6, an amplification factor setting part 7, a filter 9, an amplifier circuit 10, the A/D converting part 11, and an inverter 12.

The motor controlling part 5 outputs a sampling signal on the basis of the digital signal output and fed back by the A/D converting part 11, and inputs the sampling signal to the amplification factor set timing command part 6.

The amplification factor set timing command part 6 outputs a signal for issuing a command with respect to an amplification factor set timing (refer to FIG. 2 (A)) for changing the setting of the amplification factor by the amplification factor setting part 7, on the basis of the sampling signal input by the motor controlling part 5, in response to the sampling by the A/D converting part 11, and inputs the signal to the amplification factor setting part 7.

When the amplification factor setting part 7 changes the setting of the amplification factor (refer to FIG. 2 (B)), distortion occurs in the waveform of the signal amplified by the amplifier circuit 10 (refer to FIG. 2 (C)). Thus, the amplification factor set timing command part 6 outputs the signal for issuing the command with respect to the amplification factor set timing (refer to FIG. 2 (A)) so that a waveform stabilizing period Tst (refer to FIG. 2 (C)) until the generated distortion is stabilized does not overlap with the sampling timing at which the A/D converting part 11 performs sampling in a predetermined cycle (refer to FIG. 2 (D)), in order to prevent the A/D converting part 11 from sampling the signal having such a distorted waveform, and inputs the signal to the amplification factor setting part 7. It is noted that the waveform stabilizing period Tst, which is a period determined on the basis of a circuit constant of the amplifier circuit 10, is a period of 10 μs, as an example.

Accordingly, the amplification factor set timing command part 6 outputs the signal for issuing the command with respect to the amplification factor set timing (refer to FIG. 3 (B)) immediately after the sampling timing (refer to FIG. 3 (A)) at which the A/D converting part 11 performs sampling in a predetermined cycle, and inputs the signal to the amplification factor setting part 7.

Specifically, the amplification factor set timing command part 6 outputs the signal for issuing the command with respect to the amplification factor set timing (refer to FIG. 3 (B)) with the Z phase signal (refer to FIG. 4 (B)) as a trigger, and inputs the signal to the amplification factor setting part 7. It is noted that the Z phase signal appears aperiodically, and in the present embodiment, the A/B phase signal is sampled immediately after the Z phase signal, by using the Z phase signal as a trigger with priority over the described-above sampling performed in a predetermined cycle. Since such sampling requires higher accuracy, the amplification factor is set immediately after the sampling performed with the Z phase signal as a trigger, thereby enabling to further eliminate the influence by the distortion due to the change of the amplification factor.

The amplification factor setting part 7 changes the setting of the amplification factor of the amplifier circuit 10 at the amplification factor set timing based on the signal input by the amplification factor set timing command part 6. In an example, the amplification factor setting part 7 changes the setting of the amplification factor of the amplifier circuit 10, on the basis of the amplitude of the signal output by the detector 4. In this case, in an example, the amplification factor setting part 7 sets the value of the amplification factor lower as the amplitude is larger, and higher as the amplitude is smaller.

The filter 9 eliminates noise from the signal output by the detector 4.

The amplifier circuit 10 receives the signal which has been output by the detector 4 and from which the noise has been eliminated by the filter 9, and amplifies the signal with the amplification factor set by the amplification factor setting part 7. Then, the amplifier circuit 10 outputs the amplified signal, and inputs the signal to the A/D converting part 11.

The A/D converting part 11 performs digital conversion by sampling the signal input by the amplifier circuit 10 at the sampling timing in a predetermined cycle, outputs the signal, and feeds back the signal to the motor controlling part 5.

The motor controlling part 5 gives the inverter 12 a command, which will be described below, for turning on/off a transistor on the basis of the command signal input by the numerical control unit 2, the digital signal output and fed back by the A/D converting part 11, and the alternating current output and fed back by the inverter 12.

In an example, the inverter 12, which includes a plurality of transistors and freewheel diodes connected in reversely parallel thereto, turns the transistors on/off on the basis of the command given by the motor controlling part 5, thereby supplying the alternating current to the motor 3. The inverter 12 further feeds back to the motor controlling part 5 the alternating current to be supplied to the motor 3.

The motor driving apparatus 1 described above drives the motor 3 to rotate with the alternating current input by the inverter 12. When the motor 3 is driven to rotate, the detector 4 outputs information including the position and the speed of the motor 3 as a signal, and inputs the signal to the amplifier circuit 10 via the filter 9.

As described above, according to the present embodiment, the motor driving apparatus 1 changes the setting of the amplification factor of the amplifier circuit 10 so that the waveform stabilizing period Tst (refer to FIG. 2 (C)) does not overlap with the sampling timing (refer to FIG. 2 (D)) at which the A/D converting part 11 performs the sampling. Accordingly, the motor driving apparatus 1 is able to appropriately change the setting of the amplification factor without sampling of the signal having distortion in the waveform by the A/D converting part 11, thereby enabling to improve the detection resolution.

Further, according to the present embodiment, the setting of the amplification factor of the amplifier circuit 10 is enabled to be changed immediately after the sampling with the Z phase signal as a trigger, and thus the A/D conversion requiring higher accuracy receives no influence by the distorted waveform of the signal at the sampling timing.

Second Embodiment

Figure 5:
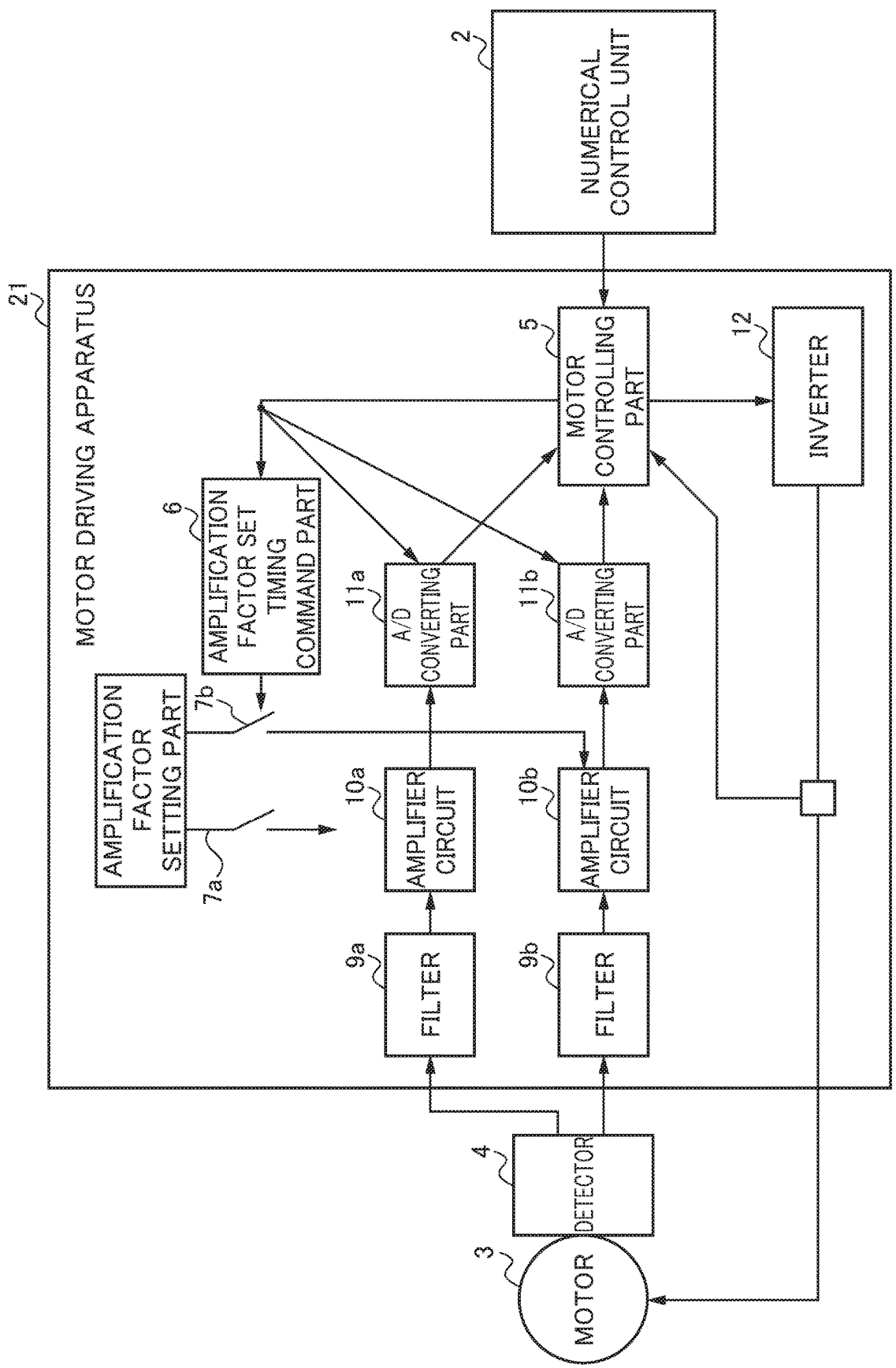
FIG. 5 is a block diagram illustrating a configuration of a motor driving apparatus according to a second embodiment.

FIG. 5 is a block diagram illustrating a configuration of a motor driving apparatus 21 according to the second embodiment of the present invention.

In the motor driving apparatus 21 according to the present embodiment, an amplifier circuit 10a and an amplifier circuit 10b respectively amplify a corresponding A phase signal and a corresponding B phase signal, and the setting of the amplification factors of the amplifier circuit 10a and the amplifier circuit 10b are changed at the same time.

As shown in FIG. 5, the motor driving apparatus 21 according to the second embodiment includes an amplification factor setting part 7a and an amplification factor setting part 7b instead of the amplification factor setting part 7, and also includes a filter 9a and a filter 9b instead of the filter 9. The motor driving apparatus 21 further includes the amplifier circuit 10a and the amplifier circuit 10b instead of the amplifier circuit 10, and also includes an A/D converting part 11a and an A/D converting part 11b instead of the A/D converting part 11.

The amplification factor setting part 7a, which corresponds to the A phase signal, changes the setting of the amplification factor of the amplifier circuit 10a at the amplification factor set timing based on the signal input by the amplification factor set timing command part 6.

The amplification factor setting part 7b, which corresponds to the B phase signal, changes the setting of the amplification factor of the amplifier circuit 10b at the amplification factor set timing based on the signal input by the amplification factor set timing command part 6.

The filter 9a, which corresponds to the A phase signal, eliminates noise from the A phase signal output by the detector 4.

The filter 9b, which corresponds to the B phase signal, eliminates noise from the B phase signal output by the detector 4.

The amplifier circuit 10a, which corresponds to the A phase signal, receives the A phase signal which has been output by the detector 4 and from which the noise has been eliminated by the filter 9a, and amplifies the A phase signal with the amplification factor set by the amplification factor setting part 7a. Then, the amplifier circuit 10a outputs the amplified A phase signal, and inputs the signal to the A/D converting part 11a.

The amplifier circuit 10b, which corresponds to the B phase signal, receives the B phase signal which has been output by the detector 4 and from which the noise has been eliminated by the filter 9b, and amplifies the B phase signal with the amplification factor set by the amplification factor setting part 7b. Then, the amplifier circuit 10b outputs the amplified B phase signal, and inputs the signal to the A/D converting part 11b.

The A/D converting part 11a, which corresponds to the A phase signal, performs digital conversion by sampling the A phase signal input by the amplifier circuit 10a at the sampling timing in a predetermined cycle, then outputs the signal, and feeds back the signal to the motor controlling part 5.

The A/D converting part 11b, which corresponds to the B phase signal, performs digital conversion by sampling the B phase signal input by the amplifier circuit 10b at the sampling timing in a predetermined cycle, then outputs the signal, and feeds back the signal to the motor controlling part 5.

As described above, in one aspect of the present embodiment, in the motor driving apparatus 21, the A/D converting part 11a corresponding to the A phase signal and the A/D converting part 11b corresponding to the B phase signal respectively perform the sampling at the same timing. Accordingly, the circuit of the amplification factor set timing command part 6 to the amplifier circuit 10a and the amplifier circuit 10b is enabled to be configured simply.

Although the embodiments according to the present invention have been described above, the present invention is not limited to the above-described embodiments. The effects described in the present embodiments are listed merely as the most preferable effects produced by the present invention, and the effects produced by the present invention are not limited to those described in the present embodiments.

EXPLANATION OF REFERENCE NUMERALS 1, 21 MOTOR DRIVING APPARATUS
2 NUMERICAL CONTROL UNIT
3 MOTOR
4 DETECTOR
5 MOTOR CONTROLLING PART
6 AMPLIFICATION FACTOR SET TIMING COMMAND PART
7, 7a, 7b AMPLIFICATION FACTOR SETTING PART
9, 9a, 9b FILTER
10, 10a, 10b AMPLIFIER CIRCUIT
11, 11a, 11b A/D CONVERTING PART
12 INVERTER

What is claimed is:

1. A motor driving apparatus for driving a motor, the motor driving apparatus comprising:
   an amplifier circuit for receiving a signal from a detector and amplifying the signal with a set amplification factor, the detector outputting the signal in a sine wave shape in response to rotation of the motor;
   an A/D converting part for performing digital conversion by sampling the signal amplified by the amplifier circuit at a sampling timing in a predetermined cycle;
   an amplification factor setting part for changing setting of the amplification factor of the amplifier circuit, wherein, during a stabilization period, distortion occurs in a waveform of the signal amplified by the amplifier circuit after changing the setting of the amplification factor; and an amplification factor set timing command part for issuing a command, at a set time, to change the amplification factor by the amplification factor setting part, wherein the set time of the issuing of the command by the amplification factor set timing command part is a time that allows the stabilization period of the waveform of the signal amplified by the amplifier circuit to not overlay with the sampling timing.

2. The motor driving apparatus according to claim 1, wherein the amplification factor set timing command part issues the command in response to the sampling by the A/D converting part.

3. The motor driving apparatus according to claim 1, wherein the detector outputs a second signal at a fixed point per rotation of the motor, and the amplification factor set timing command part issues the command in response to the sampling performed with the second signal as a trigger by the A/D converting part.

4. The motor driving apparatus according to claim 2, wherein the detector outputs a second signal at a fixed point per rotation of the motor, and the amplification factor set timing command part issues the command in response to the sampling performed with the second signal as a trigger by the A/D converting part.

5. The motor driving apparatus according to claim 1, wherein the signal includes a first phase signal and a second phase signal having different phases from each other, the amplifier circuit, the A/D converting part and the amplification factor setting part are provided so as to correspond to the first phase signal, the motor driving apparatus further comprises a second of said amplifier circuit, a second of said A/D converting part, and a second of said amplification factor setting part, which are provided so as to correspond to the second phase signal, and the amplification factor set timing command part changes the setting of the amplification factor of the amplifier circuit corresponding to the first phase signal and the setting of the amplification factor of the second amplifier circuit, corresponding to the second phase signal, at the same time.

6. The motor driving apparatus according to claim 2, wherein the signal includes a first phase signal and a second phase signal having different phases from each other, the amplifier circuit, the A/D converting part and the amplification factor setting part are respectively provided so as to correspond to the first phase signal, the motor driving apparatus further comprises a second of said amplifier circuit, a second of said A/D converting part, and a second of said amplification factor setting part, which are provided so as to correspond to the second phase signal, and the amplification factor set timing command part changes the setting of the amplification factor of the amplifier circuit corresponding to the first phase signal and the setting of the amplification factor of the second amplifier circuit, corresponding to the second phase signal, at the same time.

7. The motor driving apparatus according to claim 3, wherein the signal includes a first phase signal and a second phase signal having different phases from each other, the amplifier circuit, the A/D converting part and the amplification factor setting part are respectively provided so as to correspond to the first phase signal, the motor driving apparatus further comprises a second of said amplifier circuit, a second of said A/D converting part, and a second of said amplification factor setting part, which are provided so as to correspond to the second phase signal, and the amplification factor set timing command part changes the setting of the amplification factor of the amplifier circuit corresponding to the first phase signal and the setting of the amplification factor of the amplifier circuit, corresponding to the second phase signal, at the same time.

8. The motor driving apparatus according to claim 4, wherein the signal includes a first phase signal and a second phase signal having different phases from each other, the amplifier circuit, the A/D converting part and the amplification factor setting part are respectively provided so as to correspond to the first phase signal, the motor driving apparatus further comprises a second of said amplifier circuit, a second of said A/D converting part, and a second of said amplification factor setting part, which are provided so as to correspond to the second phase signal, and the amplification factor set timing command part changes the setting of the amplification factor of the amplifier circuit corresponding to the first phase signal and the setting of the amplification factor of the amplifier circuit, corresponding to the second phase signal, at the same time.

* * * * *